United States Patent
McMackin et al.

(10) Patent No.: US 7,811,505 B2
(45) Date of Patent: Oct. 12, 2010

(54) METHOD FOR FAST FILLING OF TEMPLATES FOR IMPRINT LITHOGRAPHY USING ON TEMPLATE DISPENSE

(75) Inventors: Ian M. McMackin, Austin, TX (US); Pankaj B. Lad, Austin, TX (US); Van N. Truskett, Austin, TX (US)

(73) Assignee: Molecular Imprints, Inc., Austin, TX (US)

( * ) Notice: Subject to any disclaimer, the term of this patent is extended or adjusted under 35 U.S.C. 154(b) by 1084 days.

(21) Appl. No.: 11/101,140

(22) Filed: Apr. 7, 2005

(65) Prior Publication Data
US 2006/0121728 A1 Jun. 8, 2006

Related U.S. Application Data

(60) Continuation-in-part of application No. 11/006,363, filed on Dec. 7, 2004, now abandoned, and a continuation-in-part of application No. 11/005,742, filed on Dec. 7, 2004, now abandoned, and a division of application No. 11/101,139, filed on Apr. 7, 2005, now Pat. No. 7,281,919.

(51) Int. Cl.
 *B28B 3/00* (2006.01)
 *B28B 17/00* (2006.01)
 *H01L 25/00* (2006.01)
(52) U.S. Cl. .............. 264/496; 977/887; 264/319; 101/167
(58) Field of Classification Search ............ 264/293, 264/319, 494, 496; 977/887; 101/151, 152, 101/154, 161, 164, 167, 169, 170
 See application file for complete search history.

(56) References Cited

U.S. PATENT DOCUMENTS 2,212,863 A 3/1940 Hughes
(Continued)

FOREIGN PATENT DOCUMENTS

JP 1-196749 8/1989
(Continued)

OTHER PUBLICATIONS

Johnson et al., Advances in Step and Flash Imprint Lithography, SPIE Microlithography Conference Feb. 23, 2003.
(Continued)

*Primary Examiner*—Matthew J. Daniels
(74) *Attorney, Agent, or Firm*—Laura C. Robinson

(57) ABSTRACT

A method of depositing material upon a substrate features filling recesses of a substrate with liquid and removing material present on the substrate, outside of the recesses using fluid, i.e., apply a vacuum of a jet of fluid. To that end, one method of the present invention includes depositing a measure of liquid upon a surface of a substrate having a recess formed therein to ingress into a volume of the recess with a portion of the liquid. A quantity of the liquid is disposed upon regions of the surface proximate to the recess. Thereafter, the quantity of liquid is removed while maintaining the portion within the volume. In this manner, the portion may be transferred onto an additional substrate. More specifically, the portion may be placed in contact with a layer of flowable material and cross-linking therewith by exposing the liquid and the flowable material to actinic radiation.

20 Claims, 8 Drawing Sheets

U.S. PATENT DOCUMENTS

| | | | |
|---|---|---|---|
| 3,044,396 A * | 7/1962 | Aller | 101/157 |
| 3,151,196 A | 9/1964 | Tipton | |
| 3,176,653 A * | 4/1965 | Hansen | 399/241 |
| 4,451,507 A | 5/1984 | Beltz et al. | |
| 4,512,848 A | 4/1985 | Deckman et al. | |
| 4,614,300 A | 9/1986 | Falcoff | |
| 4,731,155 A | 3/1988 | Napoli et al. | |
| 4,848,911 A | 7/1989 | Uchida et al. | |
| 4,959,252 A | 9/1990 | Bonnebat et al. | |
| 4,999,280 A | 3/1991 | Hiraoka | |
| 5,028,366 A | 7/1991 | Harakal et al. | |
| 5,078,947 A | 1/1992 | Nishizawa et al. | |
| 5,110,514 A | 5/1992 | Soane | |
| 5,148,037 A | 9/1992 | Suda et al. | |
| 5,151,754 A | 9/1992 | Ishibashi et al. | |
| 5,240,550 A | 8/1993 | Boehnke et al. | |
| 5,259,926 A | 11/1993 | Kuwabara et al. | |
| 5,362,940 A | 11/1994 | MacDonald et al. | |
| 5,371,822 A | 12/1994 | Horwitz et al. | |
| 5,425,848 A | 6/1995 | Haisma et al. | |
| 5,480,047 A | 1/1996 | Tanigawa et al. | |
| 5,507,411 A | 4/1996 | Peckels | |
| 5,512,131 A | 4/1996 | Kumar et al. | |
| 5,545,367 A | 8/1996 | Bae et al. | |
| 5,562,951 A * | 10/1996 | Kamen | 427/493 |
| 5,601,641 A | 2/1997 | Stephens | |
| 5,669,303 A | 9/1997 | Maracas et al. | |
| 5,693,375 A * | 12/1997 | Sato et al. | 427/522 |
| 5,694,961 A | 12/1997 | Begemann et al. | |
| 5,723,176 A | 3/1998 | Keyworth et al. | |
| 5,731,981 A | 3/1998 | Simard | |
| 5,747,102 A | 5/1998 | Smith et al. | |
| 5,772,905 A | 6/1998 | Chou | |
| 5,776,748 A | 7/1998 | Singhvi et al. | |
| 5,812,629 A | 9/1998 | Clauser | |
| 5,820,769 A | 10/1998 | Chou | |
| 5,837,892 A | 11/1998 | Cavallaro et al. | |
| 5,849,209 A | 12/1998 | Kindt-Larsen et al. | |
| 5,849,222 A | 12/1998 | Jen et al. | |
| 5,858,580 A | 1/1999 | Wang et al. | |
| 5,888,650 A | 3/1999 | Calhoun et al. | |
| 5,912,049 A | 6/1999 | Shirley | |
| 5,938,080 A | 8/1999 | Hasser et al. | |
| 5,948,470 A | 9/1999 | Harrison et al. | |
| 5,956,216 A | 9/1999 | Chou | |
| 5,974,150 A | 10/1999 | Kaish et al. | |
| 5,988,859 A | 11/1999 | Kirk | |
| 5,992,320 A * | 11/1999 | Kosaka et al. | 101/401.1 |
| 6,027,595 A | 2/2000 | Suleski | |
| 6,046,056 A | 4/2000 | Parce et al. | |
| 6,074,827 A | 6/2000 | Nelson et al. | |
| 6,089,853 A | 7/2000 | Biebuyck et al. | |
| 6,112,588 A | 9/2000 | Cavallaro et al. | |
| 6,218,316 B1 | 4/2001 | Marsh | |
| 6,234,379 B1 | 5/2001 | Donges | |
| 6,274,294 B1 | 8/2001 | Hines | |
| 6,279,474 B1 | 8/2001 | Liebl | |
| 6,309,580 B1 | 10/2001 | Chou | |
| 6,326,627 B1 | 12/2001 | Putvinski et al. | |
| 6,334,960 B1 | 1/2002 | Willson et al. | |
| 6,348,999 B1 | 2/2002 | Summersgill et al. | |
| 6,355,198 B1 | 3/2002 | Kim et al. | |
| 6,361,831 B1 | 3/2002 | Sato et al. | |
| 6,377,868 B1 | 4/2002 | Gardner, Jr. | |
| 6,391,217 B2 | 5/2002 | Schaffer et al. | |
| 6,482,742 B1 | 11/2002 | Chou | |
| 6,498,640 B1 | 12/2002 | Ziger | |
| 6,510,356 B2 | 1/2003 | Seshan | |
| 6,517,977 B2 | 2/2003 | Resnick et al. | |
| 6,517,995 B1 | 2/2003 | Jacobson et al. | |
| 6,518,189 B1 | 2/2003 | Chou | |
| 6,580,172 B2 | 6/2003 | Mancini et al. | |
| 6,588,632 B1 | 7/2003 | Nicol | |
| 6,600,969 B2 | 7/2003 | Sudolcan et al. | |
| 6,621,960 B2 | 9/2003 | Wang et al. | |
| 6,646,662 B1 | 11/2003 | Nebashi et al. | |
| 6,678,038 B2 | 1/2004 | Binnard | |
| 6,696,220 B2 | 2/2004 | Bailey et al. | |
| 6,713,238 B1 | 3/2004 | Chou et al. | |
| 6,776,094 B1 | 8/2004 | Whitesides et al. | |
| 6,805,541 B1 | 10/2004 | Hashimoto | |
| 6,809,356 B2 | 10/2004 | Chou | |
| 6,820,677 B2 | 11/2004 | Grinberg et al. | |
| 6,828,244 B2 | 12/2004 | Chou | |
| 6,849,558 B2 | 2/2005 | Schaper | |
| 6,855,293 B1 | 2/2005 | Zengerle et al. | |
| 6,870,584 B2 | 3/2005 | Kawase et al. | |
| 6,873,087 B1 | 3/2005 | Choi et al. | |
| 6,900,881 B2 | 5/2005 | Sreenivasan et al. | |
| 6,908,861 B2 | 6/2005 | Sreenivasan et al. | |
| 6,916,584 B2 | 7/2005 | Sreenivasan et al. | |
| 6,916,585 B2 | 7/2005 | Sreenivasan et al. | |
| 6,926,929 B2 | 8/2005 | Watts et al. | |
| 6,932,934 B2 | 8/2005 | Choi et al. | |
| 6,946,360 B2 | 9/2005 | Chou | |
| 6,955,767 B2 | 10/2005 | Chen | |
| 6,964,793 B2 | 11/2005 | Willson et al. | |
| 7,077,992 B2 | 7/2006 | Sreenivasan et al. | |
| 7,117,583 B2 | 10/2006 | Dinan et al. | |
| 7,128,875 B2 | 10/2006 | Cubicciotti | |
| 7,157,036 B2 | 1/2007 | Choi et al. | |
| 7,252,715 B2 | 8/2007 | Watts et al. | |
| 7,281,919 B2 | 10/2007 | Shackleton et al. | |
| 2002/0005880 A1 | 1/2002 | Ashe et al. | |
| 2002/0042027 A1 | 4/2002 | Chou et al. | |
| 2002/0094496 A1 | 7/2002 | Choi et al. | |
| 2002/0132482 A1 | 9/2002 | Chou | |
| 2002/0135099 A1 | 9/2002 | Robinson et al. | |
| 2002/0167117 A1 | 11/2002 | Chou | |
| 2002/0168578 A1 | 11/2002 | Wang et al. | |
| 2002/0170880 A1 | 11/2002 | Chen | |
| 2003/0025895 A1 | 2/2003 | Binnard | |
| 2003/0034329 A1 | 2/2003 | Chou | |
| 2003/0062334 A1 | 4/2003 | Lee et al. | |
| 2003/0080471 A1 | 5/2003 | Chou | |
| 2003/0080472 A1 | 5/2003 | Chou | |
| 2003/0081193 A1 | 5/2003 | White et al. | |
| 2003/0137494 A1 | 7/2003 | Tulbert | |
| 2003/0174435 A1 | 9/2003 | Dinan et al. | |
| 2003/0186140 A1 | 10/2003 | Fries | |
| 2004/0029041 A1 | 2/2004 | Shih et al. | |
| 2004/0036201 A1 | 2/2004 | Chou et al. | |
| 2004/0046288 A1 | 3/2004 | Chou | |
| 2004/0058067 A1 | 3/2004 | Law et al. | |
| 2004/0065976 A1 | 4/2004 | Sreenivasan et al. | |
| 2004/0110856 A1 | 6/2004 | Young et al. | |
| 2004/0118809 A1 | 6/2004 | Chou et al. | |
| 2004/0131718 A1 | 7/2004 | Chou et al. | |
| 2004/0137734 A1 | 7/2004 | Chou et al. | |
| 2004/0156108 A1 | 8/2004 | Chou et al. | |
| 2004/0192041 A1 | 9/2004 | Jeong et al. | |
| 2004/0197843 A1 | 10/2004 | Chou et al. | |
| 2004/0231781 A1 | 11/2004 | Bao et al. | |
| 2004/0241324 A1 | 12/2004 | Watts et al. | |
| 2004/0250945 A1 | 12/2004 | Zheng et al. | |
| 2004/0256764 A1 | 12/2004 | Choi et al. | |
| 2005/0037143 A1 | 2/2005 | Chou et al. | |
| 2005/0056963 A1 | 3/2005 | McCutcheon | |
| 2005/0106321 A1 | 5/2005 | McMackin et al. | |
| 2005/0160011 A1 | 7/2005 | Sreenivasan et al. | |
| 2005/0189676 A1 | 9/2005 | Sreenivasan | |
| 2005/0270312 A1 | 12/2005 | Lad et al. | |
| 2006/0062867 A1 | 3/2006 | Choi et al. | |
| 2006/0076717 A1 | 4/2006 | Sreenivasan et al. | |

| | | | |
|---|---|---|---|
| 2006/0077374 A1 | 4/2006 | Sreenivasan et al. | |
| 2006/0121141 A1 | 6/2006 | Shackleton et al. | |
| 2006/0279024 A1 | 12/2006 | Choi et al. | |

FOREIGN PATENT DOCUMENTS

| | | |
|---|---|---|
| JP | 02-24848 | 1/1990 |
| JP | 02-92603 | 4/1990 |
| JP | 02192045 | 7/1990 |
| WO | WO 87/02935 | 5/1987 |
| WO | WO 98/24070 | 6/1998 |
| WO | WO 99/05724 | 2/1999 |
| WO | WO 00/21689 | 4/2000 |
| WO | WO 01/47003 | 6/2001 |

OTHER PUBLICATIONS

Chou et al., Lithographically Induced Self-assembly of Periodic Polymer Micropillar Arrays, J. Vac. Sci. Technol. B 17 (6), pp. 3197-3202 Nov. 1, 1999.

Colburn et al., Step and Flash Imprint Lithography: A New Approach to High-Resolution Patterning, Proc. Of SPIE, vol. 3676 Mar. 1, 1999.

Chou, Nanoimprint Lithography and Lithographically Induced Self-Assembly, MRS Bulletin, pp. 512-517 Jul. 1, 2001.

Choi et al., Design of Orientation Stages for Step and Flash Imprint Lithography, Precision Engineering, pp. 192-199 Jan. 1, 2001.

Xia et al., Soft Lithography, Angew. Chem. Int. Ed., pp. 550-575 Jan. 1, 1998.

Chou et al., Imprint Lithography with Sub-10 nm Feature Size and High Throughput, Microelectronic Engineering 35, pp. 237-240 Jan. 1, 1997.

Haisma et al., Mold-assisted Nanolithography: A Process for Reliable Pattern Replication, J. Vac. Sci. Technol. B, pp. 4124-4128 Nov. 1, 1996.

Chou et al., Imprint of Sub-25 nm Vias and Trenches in Polymers, Appl. Phys. Lett. 67 (21) Nov. 20, 1995.

Nguyen, Asymmetric Fluid-Structure Dynamics in Nanoscale Imprint Lithography, The University of Texas at Austin, pp. 1-111 Aug. 1, 2001.

Colburn et al., Step and Flash Imprint Lithography for sub-100 nm Patterning, Proceedings of SPIE vol. 3997, pp. 453-457 Jan. 1, 2000.

Chou et al., Imprint Lithography with 25-Nanometer Resolution, Science vol. 272, pp. 85-87 Apr. 5, 1996.

Heidari, Nanoimprint Lithography at the 6 in. Wafer Scale, J. Vac. Sci. Technol. B 18(6), pp. 3557-3560 Nov. 1, 2000.

Abstract of Japanese Patent 02-92603, Aug. 12, 2004.

Translation of Japanese Patent 02-92603, Apr. 3, 1990.

Translation of Japanese Patent 02-24848, Jan. 26, 1990.

Abstract of Japanese Patent 02-24848, Jan. 26, 1990.

Chou et al., Ultrafast and Direct Imprint of Nanostructures in Silicon, Nature, col. 417, (Jun. 2002), pp. 835-837 Jun. 1, 2002.

Colburn et al., Development and Advantages of Step-and-Flash Lithography, Solid State Technology Jul. 1, 2001.

Colburn et al., Characterization and Modeling of Volumetric and Mechanical Properties for Step and Flash Imprint Lithography Photopolymers, Journal of Vacuum Science Technology. vol b. 19(6) Nov. 1, 2001.

Bailey et al., Step and Flash Imprint Lithography: Defect Analysis, Journal of Vacuum Science, B 19(6), pp. 2806-2810 Nov. 1, 2001.

Bailey et al., Step and Flash Imprint Lithography: Template Surface Treatment and Defect Analysis, Journal of Vacuum Science, B 18(6), pp. 3572-3577 Nov. 1, 2000.

Schneider et al., Stripes of Partially Fluorinated Alkyl Chains: Dipolar Langmuir Monolayers, J. Chem. Phys. vol. 122, Issue 9 Mar. 1, 2005.

Colburn et al., Dissertation for the Degree of Doctor of Philosophy, Step and Flash Imprint Lithography: A Low-Pressure, Room-Temperature Nanoimprint Lithography Aug. 1, 2001.

Abstract of Japanese patent 02-192045, Jul. 27, 1990.

Chou et al., Nanoimprint Lithography, Journal of Vacuum Science Technolgoy B 14(16), pp. 4129-4133 Nov. 1, 1996.

U.S. Appl. No. 11/005,742, naming Inventors McMackin et al., entitled Method for Fast Filling of Templates for Imprint Lithography using on Template Dispense, filed Dec. 7, 2004.

U.S. Appl. No. 11/012,375, naming Inventors Xu et al., entitled Method to Reduce Adhesion between a Conformable Region and a Mold, filed Dec. 15, 2004.

nerac.com Retro Search, Fluid Dispensing, May 4, 2005.

U.S. Appl. No. 11/143,092, naming Inventors Lad et al., entitled Fluid Dispensing and Drop-on-Demand Dispensing for Nano-Scale Manufacturing, filed Jun. 2, 2005.

Brubaker et al., Investigating The Use of Spray-Coating Technology in MEMS Applications, Micro Magazine, pp. 45-55 Mar. 1, 2004.

U.S. Appl. No. 11/459,797, naming Inventors Choi et al., entitled Method for Providing Desirable Wetting and Release Characteristics between a Mold and a Polymerizable Composition, filed Jul. 25, 2006.

* cited by examiner

METHOD FOR FAST FILLING OF TEMPLATES FOR IMPRINT LITHOGRAPHY USING ON TEMPLATE DISPENSE

CROSS-REFERENCE TO RELATED APPLICATIONS

The present application is a continuation in part of U.S. patent application Ser. No. 11/006,363, filed Dec. 7, 2004, entitled SYSTEM FOR CONTROLLING A VOLUME OF MATERIAL REMAINING ON A MOLD EMPLOYED IN FAST FILLING IMPRINT LITHOGRAPHY PROCESSES, and having Steven C. Shackleton, Ian M. McMackin, Pankaj B. Lad and Van N. Truskett listed as inventors; a continuation-in-part of U.S. patent application Ser. No. 11/005,742, filed Dec. 7, 2004, entitled METHOD FOR FAST FILLING OF TEMPLATES FOR IMPRINT LITHOGRAPHY USING ON TEMPLATE DISPENSE and having Ian M. McMackin, Pankaj B. Lad and Van N. Truskett lists as inventors; and is related in subject matter to U.S. patent application Ser. No. 11/101,139, filed Apr. 7, 2005, entitled SYSTEM FOR CONTROLLING A VOLUME OF MATERIAL ON A MOLD, and having Steven C. Shackleton, Ian M. McMackin, Pankaj B. Lad and Van N. Truskett listed as inventors. All of the aforementioned patent applications are incorporated by reference herein.

BACKGROUND OF THE INVENTION

The field of the invention relates generally to nano-fabrication of structures. More particularly, the present invention is directed to a method for filling a recess of a patterned substrate for use in imprint lithography.

Nano-fabrication involves the fabrication of very small structures, e.g., having features on the order of nanometers or smaller. One area in which nano-fabrication has had a sizeable impact is in the processing of integrated circuits. As the semiconductor processing industry continues to strive for large production yields while increasing the circuits per unit area formed on a substrate, nano-fabrication becomes increasingly important. Nano-fabrication provides greater process control while allowing increased reduction of the minimum feature dimension of the structures formed. Other areas of development in which nano-fabrication have been employed include biotechnology, optical technology, mechanical systems and the like.

An exemplary nano-fabrication technique is commonly referred to as imprint lithography and is described in detail in numerous publications, such as United States published patent application 2004/0065976 filed as U.S. patent application Ser. No. 10/264,960, entitled "Method and a Mold to Arrange Features on a Substrate to Replicate Features having Minimal Dimensional Variability"; United States published patent application 2004/0065252 filed as U.S. patent application Ser. No. 10/264,926, entitled "Method of Forming a Layer on a Substrate to Facilitate Fabrication of Metrology Standards"; and United States published patent application 2004/0046271 filed as U.S. patent application Ser. No. 10/235,314, entitled "Method and a Mold to Arrange Features on a Substrate to Replicate Features having Minimal Dimensions Variability"; all of which are assigned to the assignee of the present invention. The fundamental imprint lithography technique as shown in each of the aforementioned published patent applications includes formation of a relief pattern in a polymerizable layer and transferring a pattern corresponding to the relief pattern into an underlying substrate. To that end, a template, having a template active area, is employed spaced-apart from the substrate with a formable liquid present between the template and the substrate. The liquid is solidified to form a solidified layer that has a pattern recorded therein that is conforming to a shape of the surface of the template active area. The substrate and the solidified layer are then subjected to processes to transfer, into the substrate, a relief image that corresponds to the pattern in the solidified layer.

One manner in which to locate the polymerizable liquid between the template and the substrate is by depositing the liquid on the substrate. Thereafter, the polymerizable liquid is concurrently contacted by both the template and the substrate to spread the polymerizable liquid over the surface of the substrate and fill the features of the template. It is desirable to minimize the time required to fill the features of the template, referred to as fill time. Thus, there is a need to provide improved techniques to fill the features of a template.

SUMMARY OF THE INVENTION

A method of depositing material upon a substrate features filling recesses of a substrate with liquid and removing material present on the substrate, outside of the recesses using fluid, i.e., apply a vacuum or a jet of fluid. To that end, one method of the present invention includes depositing a measure of liquid upon a surface of a substrate having a recess formed therein to ingress into a volume of the recess with a portion of the liquid. A quantity of the liquid is disposed upon regions of the surface proximate to the recess. Thereafter, the quantity of liquid is removed while maintaining the portion within the volume. In this manner, the portion may be transferred onto an additional substrate. More specifically, the portion may be placed in contact with a layer of flowable material and cross-linking therewith by exposing the liquid and the flowable material to actinic radiation. These and other embodiments are discussed further below.

DETAILED DESCRIPTION OF THE INVENTION

Figure 1:
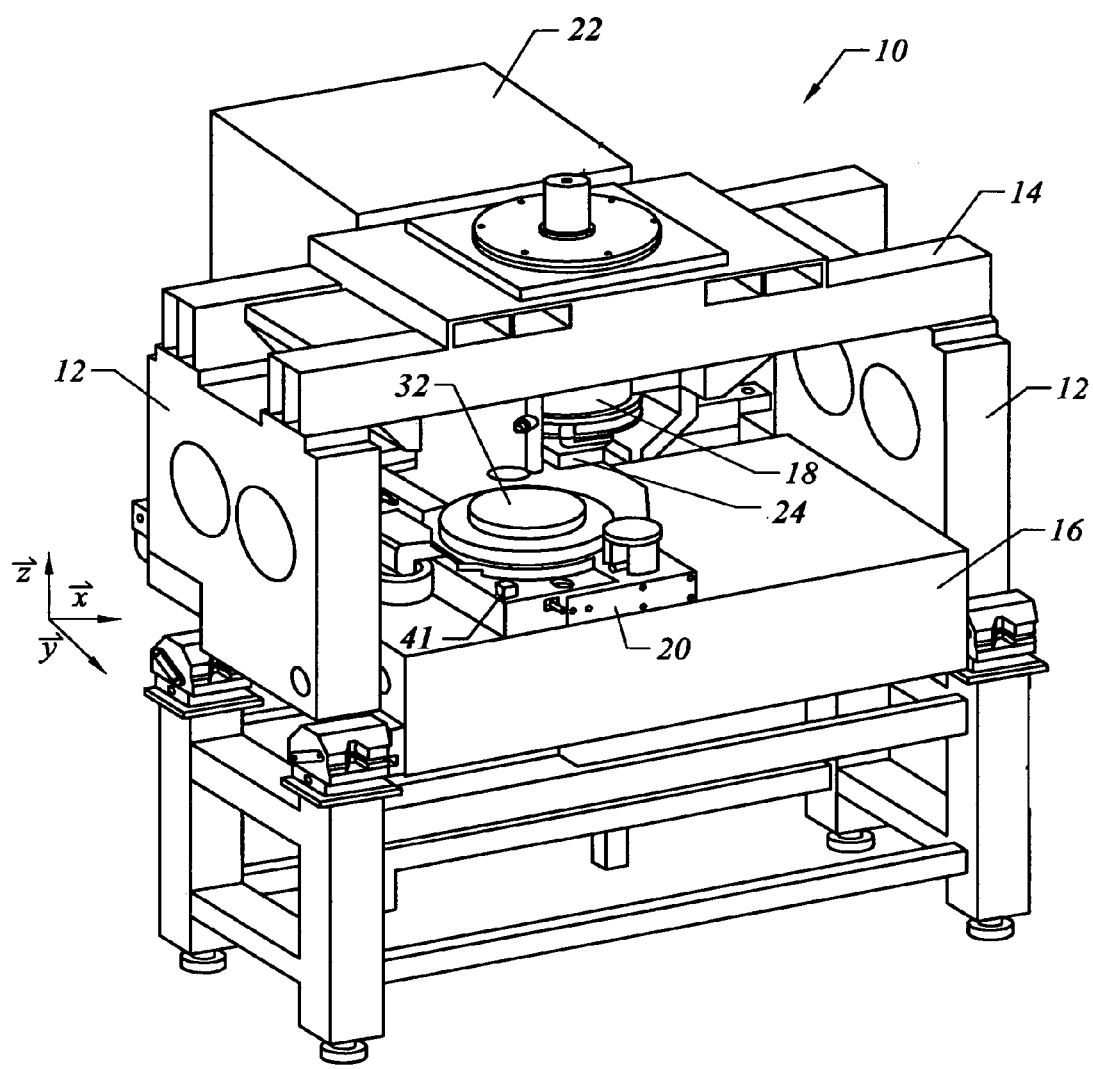
FIG. 1 is a perspective view of a lithographic system in accordance with the present invention.

FIG. 1 depicts a lithographic system 10 in accordance with one embodiment of the present invention that includes a pair of spaced-apart bridge supports 12 having a bridge 14 and a stage support 16 extending therebetween. Bridge 14 and stage support 16 are spaced-apart. Coupled to bridge 14 is an imprint head 18, which extends from bridge 14 toward stage support 16. Disposed upon stage support 16 to face imprint head 18 is a motion stage 20. Motion stage 20 is configured to move with respect to stage support 16 along X and Y axes and may provide movement along the Z axis as well. An exemplary motion stage device is disclosed in U.S. patent application Ser. No. 10/194,414, filed Jul. 11, 2002, entitled "Step and Repeat Imprint Lithography Systems," assigned to the assignee of the present invention and is incorporated by reference herein. A radiation source 22 is coupled to system 10 to impinge actinic radiation upon motion stage 20.

Figure 2:
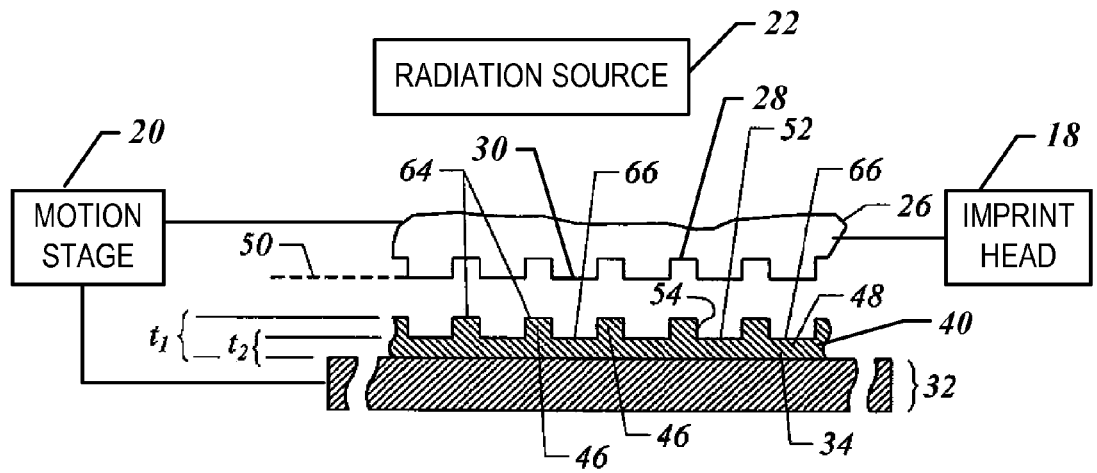
FIG. 2 is a simplified elevation view of a lithographic system, shown in FIG. 1, employed to create a patterned imprinting layer in accordance with one embodiment of the present invention.

Referring to both FIGS. 1 and 2, connected to imprint head 18 is a template 24 having a mold 26 thereon, which may define a smooth or planar surface or have a pattern formed therein. As shown, mold 26 includes a pattern having a plurality of features defined by a plurality of spaced-apart recesses 28 and projections 30. Projections 30 have a width $W_1$, and recesses 28 have a width $W_2$, both of which are measured in a direction that extends transversely to the Z axis. The plurality of features defines an original pattern that forms the basis of a pattern to be transferred into a substrate 32 positioned on motion stage 20. To that end, imprint head 18 is adapted to move along the Z axis and vary a distance "d" between mold 26 and substrate 32. Alternatively, or in conjunction with imprint head 18, motion stage 20 may move template 24 along the Z-axis. In this manner, the features on mold 26 may be imprinted into a flowable region employed to pattern substrate 32, discussed more fully below.

Radiation source 22 is located so that mold 26 is positioned between radiation source 22 and substrate 32, with actinic radiation generated by radiation source 22 propagating through mold 26. As a result, it is desired that mold 26 be fabricated from material that is substantially transparent to the actinic radiation. Exemplary materials from which mold 26 may be fabricated include fused-silica, quartz, silicon, organic polymers, siloxane polymers, borosilicate glass, fluorocarbon polymers, metal, and combinations of the above dependent upon the actinic radiation employed. An exemplary system is available under the trade name IMPRIO 100™ from Molecular Imprints, Inc. having a place of business at 1807-C Braker Lane, Suite 100, Austin, Tex. 78758. The system description for the IMPRIO 100™ is available at www.molecularimprints.com and is incorporated herein by reference.

System 10 facilitates formation of a patterned layer 40 upon substrate 32 that has a shape complementary to a shape of mold 26. As a result, patterned layer 40 includes projections 46 that are complementary to the shape of recessions 28 and recesses 48 that are complementary to the shape of protrusions 30. Patterned layer 40 results from the placement of polymerizable material between substrate 32 and mold 26 and minimizing distance "d", leaving projections 46 with a thickness $t_1$ and recesses 48 with a thickness $t_2$. Thickness $t_2$ is referred to as a residual thickness. Thicknesses "$t_1$" and "$t_2$" may be any thickness desired, dependent upon the application.

After distance "d" has been reached, radiation source 22 produces actinic radiation that polymerizes and cross-links the material of pattern layer 40. This process may be repeated several times to sequentially pattern different regions (not shown) of substrate 32, referred to as a step and repeat process. Alternatively mold 26 may be sized so that the entire area of a surface of substrate 32 is patterned concurrently, i.e., with one imprinting by mold 26.

In accordance with the present invention, patterned layer is formed by depositing polymerizable material on mold 26. Specifically, a measure of the polymerizable material, in a flowable/liquid state, is deposited upon mold 26. A portion of the measure ingresses into one or more of recessions 28, filling the volume thereof. A quantity of the measure of flowable polymerizable material is present upon regions of the surface of mold 26 proximate to the one or more recessions 28 of said recess, i.e., outside of the volume of all of the recessions 28 present. Typically, the portion of the flowable polymerizable material fills the entire volume of each of recessions 28 present. Thereafter, substantially all, if not all, of the quantity of the flowable polymerizable material outside of the volume of recessions 28 is removed from mold 26. In this fashion, all or a sub-group of recessions 28 of mold 26 is completely filled with flowable polymerizable material.

Figure 3:
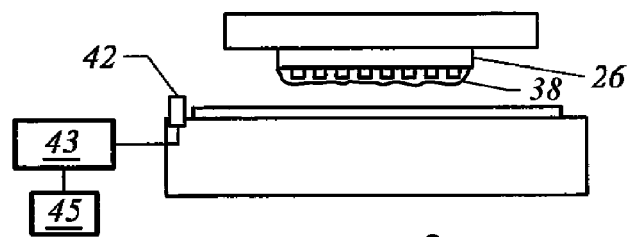
FIG. 3 is a detailed side view showing the fluid dispense mechanism included in the system, shown in FIG. 1, in accordance with a first embodiment of the present invention.

Referring to FIGS. 1 and 3, depositing flowable polymerizable material may be achieved employing a number of techniques. For example, system 10 may include one or more fluid dispensing mechanisms 41 that may include one or more spray nozzles, one of which is shown as nozzle 42. Nozzle 42 is in fluid communication with a supply 43, the flowable polymerizable material and a pump 45. Pump 45 provides fluid pressure to facilitate projection of material 40 from nozzle 42, ensuring a sufficient number of droplets (not shown) accumulate on mold 26 to essentially flood the same with a coating 38 of flowable imprinting material to ensure all features are covered and filled. Nozzle 42 is mounted to motion stage 20 to facilitate having nozzle 42 to be selectively placed in superimposition with any portion of mold 26. In this manner, coating 38 may be deposited on mold 26 in any pattern desired.

Figure 4:
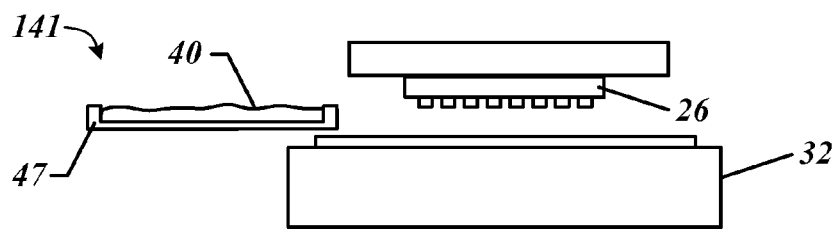
FIG. 4 is a detailed side view showing the fluid dispense mechanism included in the system, shown in FIG. 1, in accordance with a second embodiment of the present invention.

Referring to FIGS. 1 and 4, another manner by which to deposit flowable polymerizable material to mold 26 employs a fluid dispensing mechanism 141 with a transfer platen 47 containing the flowable polymerizable material 40. Platen 47 may be selectively disposed between mold 26 and substrate 32, or positioned adjacent to substrate 32, with mold 26 selectively positioned to be in superimposition therewith. Mold 26 is placed in contact with the flowable polymerizable material 40 contained in platen 47. The area of platen 47 is established so that the entire area of mold 26 may be placed in contact with material 40 contained in platen 47. It is conceivable that this dip-coating technique may be employed to create a self-assembled monolayer of flowable polymerizable material 40 on mold 26 not unlike a Langmiur-Blodgette monolayer. However, it is sufficient to merely create a contiguous coating 38 that covers and/or fills the features of the pattern of mold 26 similar to FIG. 3.

Figure 5:
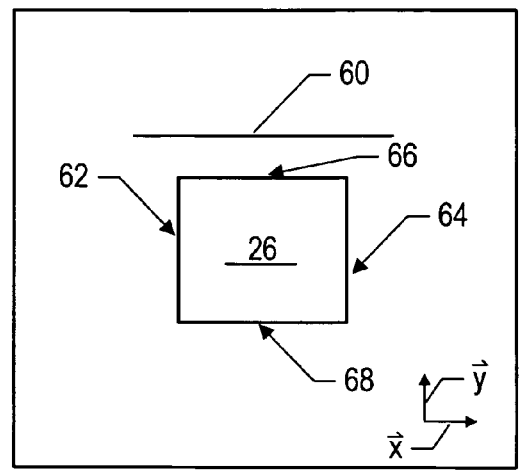
FIG. 5 is a bottom-up view of a template shown in FIG. 1 having a mold thereon.

Referring to FIG. 5, removal of the quantity of flowable polymerizable material outside of the volume of recessions may be achieved by subjecting the same to a stream of fluid, such as a gas. To that end, a vacuum wipe technique, an air knife technique or both may be employed. In both cases, mold 26 is exposed to stream of fluid 60 that is contiguous between opposed sides 62 and 64 of mold 26, in a first direction, such as X, and is substantially smaller than mold 26, in a second direction, such as Y that extends transversely to the first direction. Relative movement between stream of fluid 60 and mold 26 along the Y direction occurs, e.g., so that movement from side 66 to side 68 occurs. This exposes the entire area of mold 26 to stream of fluid 60.

Figure 6:
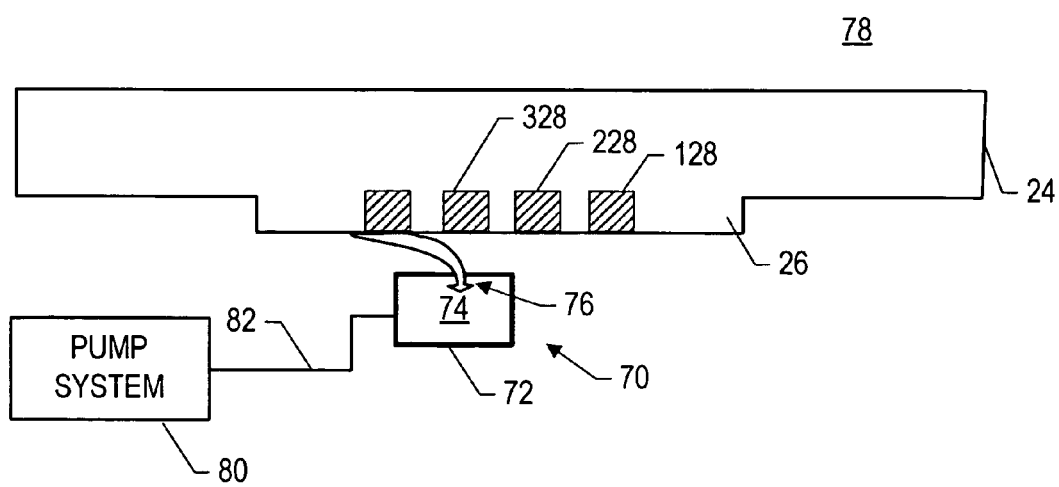
FIG. 6 is a simplified side view of the template shown in FIG. 5, having liquid polymerizable material disposed thereon, with a vacuum wipe employed to remove a quantity of the liquid polymerizable material in accordance with the present invention.

Referring to FIGS. 5 and 6, in one embodiment, stream of fluid 60 is produced by a vacuum wipe 70 that includes a body 72 defining a volume 74 and having an orifice 76 placing said volume in fluid communication with an ambient 78 in which vacuum wipe 70 is disposed. Volume 74 is placed in fluid communication with a pump system 80 over a feed line 82. Pump system 80 creates a pressure differential between volume 74 and ambient 78 so that volume 74 is pressurized to a level that is less than the pressure of ambient 78, e.g., pump system 80 may create a negative pressure within volume 74. The aforementioned pressure differential results in the quantity of liquid polymerizable material not disposed in recessions 28 being drawn away from mold 26 and into a reservoir (not shown) of pump system 80. The pressure differential, however, is selected so that the portion of liquid polymerizable material disposed within the volume of recessions 28, remains or a thin layer of polymerizable material remains covering recessions 28. This is shown with respect to recessions 128, 228 and 328.

Figure 7:
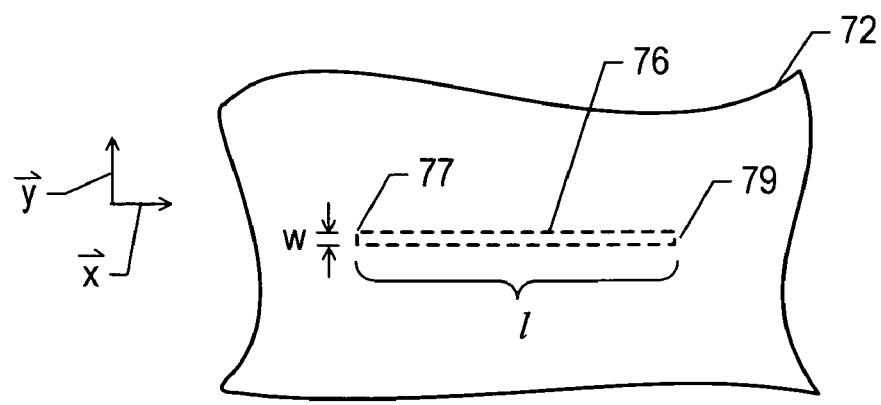
FIG. 7 is a detailed view of an orifice included in the vacuum wipe shown in FIG. 6.
Figure 8:
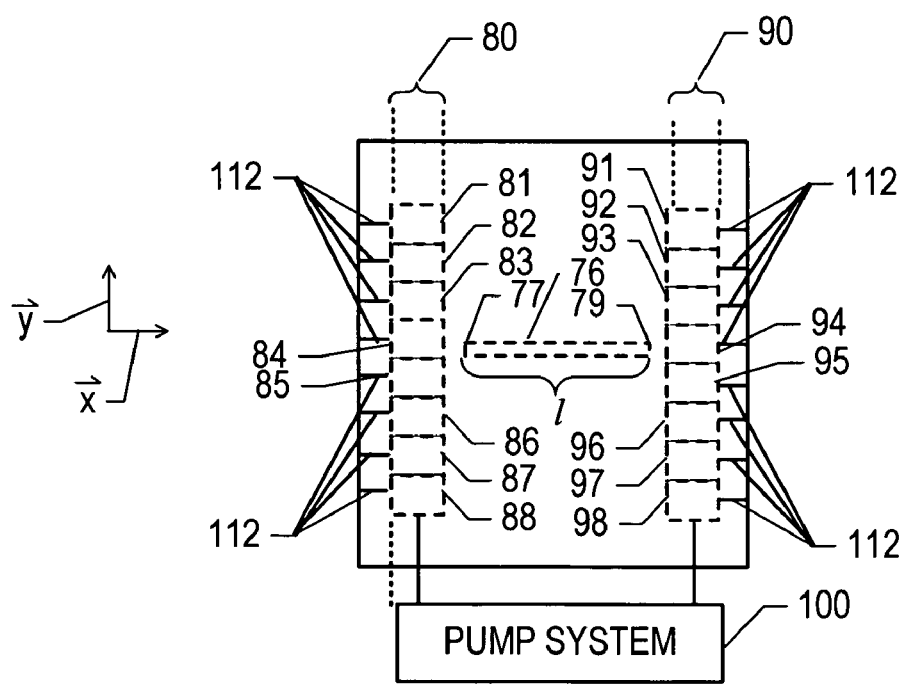
FIG. 8. is a detailed bottom-up view of the body of the vacuum wipe shown in FIG. 6 coupled to a pump system.

To that end, as shown in FIGS. 7 and 8, orifice 76 is provided with a substantially rectangular configuration having a length, l, measured along the X direction between opposed ends 77 and 79, as well as a width w, and measured along the Y direction. Length, l, extends in a direction transverse to the relative motion between body 72 and mold 26, with width, w, being substantially smaller than the length l. Typically length, l, is at least five times greater than width, w. In the present example, length, l, is typically greater than the dimension of mold 26, which is approximately 25-30 millimeters, and width, w, is selected to optimize removal of the polymerizable material at approximately 0.49 millimeters. Body 72 is disposed so that orifice 74 faces mold 26 and is spaced-apart therefrom a distance, h, shown more clearly in FIG. 6. Distance h, is selected based upon several factors, including the viscosity of the polymerizable material disposed on mold 26, the adhesions characteristics of the polymerizable material to mold 26, as well as the pressure differential between volume 74 and ambient 78.

Figure 9:
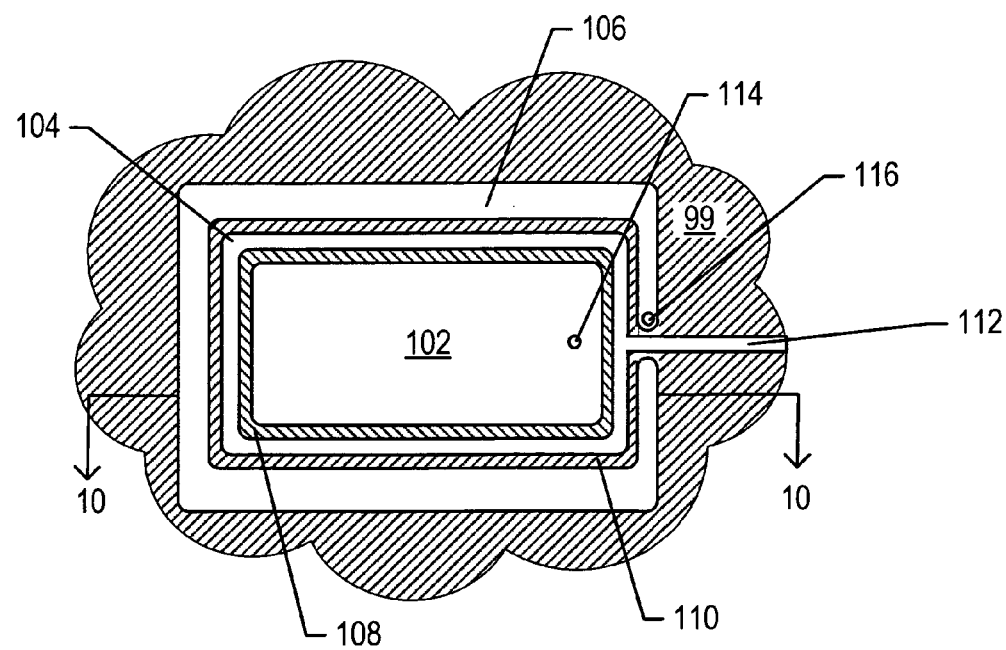
FIG. 9 is a detailed plan view of an air bearing element shown in FIG. 8.
Figure 10:
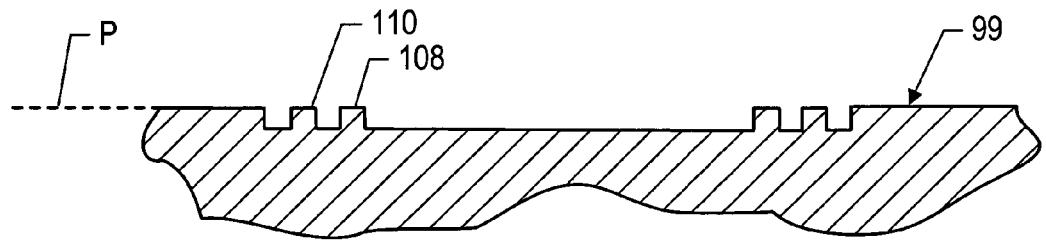
FIG. 10 is a cross-sectional view of the air bearing element shown in FIG. 9 taken across line 10-10.

Referring to FIGS. 6, 8 and 9, to assist in controlling height, h, body 72 includes two spaced-apart sets of air bearings, shown as 80 and 90, flanking orifice 76. Specifically, orifice 76 extends between air bearings 80 and 90, with end 77 being positioned proximate to air bearing 80 and spaced-apart therefrom. End 79 is positioned proximate to air bearing 90 and spaced-apart therefrom, e.g., 2 millimeters. Air bearings 80 and 90 are in fluid communication with a pump system 100 that may be configured to provide the necessary fluid flow. To that end, each of air bearings 80 and 90 includes a plurality of bearing elements, shown as 81-88 and 91-98. Each of elements 81-88 is positioned in abutting relationship with each bearing element 81-88 adjacent thereto to form a sequence of bearing elements collinear in a direction transverse to the direction along which length, l, is measured. As shown, the sequence along which bearing elements 81-88 are arranged is along the Y direction. In a similar fashion, bearing elements 91-98 are arranged on an opposing side of said body 72.

Referring to FIGS. 8, 9, 10 and 11, each of bearing elements 81-88 and 91-98, are typically integrally formed with body 72, and include a plurality of coplanar areas 99, 108 and 110 of body 72. As shown, three polygonal regions are concentrically formed into recessed areas 102, 104 and 106. Although each of regions 102, 104 and 106 has rectangular shapes, any shape may be employed, including non-polygonal shapes, such as a circle. Although not required, the area of region 102 is substantially larger than the area of either region 104 or region 106, with the region of 106 being greater than the area of region 104. Region 102 is separated from region 104 by land 108 that surrounds region 102 and is approximately 1 millimeter in width. An additional land 110 separates region 104 and 106. The apex surfaces of lands 108, 110 and surface 99 lie in a common plane. A throughway 112 extends from region 104 parallel to plane P along a direction transverse to terminating in an aperture (not shown) in said body 72. A throughway 112 is also present in region 102, placing the same in fluid communication with pump system 100. Similarly, a throughway 116 is present in region 106, placing the same in fluid communication with pump system 100.

In operation, a pressure differential is created between regions 102, 104 and 106, with region 106 having a greater pressure than either regions 102 and 104. Typically pump system 100 introduces a positive flow of fluid into throughway 116 pressurizing region 106 to be greater than ambient pressure. Pump system 100 typically applies a vacuum to throughway 114, creating a vacuum in region 102. Region 104 is typically maintained at ambient pressure levels and operates to stabilize the pressure differential present in regions 102 and 106.

Figure 11:
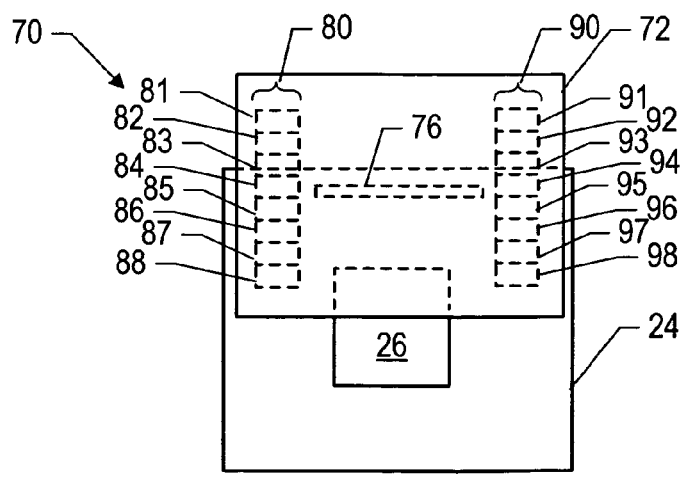
FIG. 11 is a simplified plan view showing the body shown in FIG. 6 in superimposition with the template shown in FIG. 5.

Referring to FIGS. 6 and 11, body 72 is placed in superimposition with template 24 so that orifice 76 extends across an extent of mold 26 with air bearings 80 and 90 being in superimposition with regions of template 24 outside of mold 26. Relative motion between template 24 and body 72 along a single direction is undertaken, referred to as a pass, to remove the liquid polymerizable material, as discussed above. If necessary, however, additional passes may occur in the same direction as the first pass, or in opposite or orthogonal directions, by simply re-orientating template 24 and body 72 by rotating one with respect to the other 90°.

Referring to FIGS. 6, 8, 9 and 11, air bearings 80 and 90 are arranged so as to create a positive flow of fluid to impinge upon template 24 pushing body 72 away therefrom to maintain desired spacing, h. It has been found beneficial to independently control fluid propagating between pump system 100 and throughways 114 and 116. In this manner sudden changes in pressure, such as when one or more of air bearing elements are no longer in superimposition with template 24, shown as 81-83 and 91-93, does not vary the pressure associated with regions 102, 104 and 106 of the remaining air bearing elements, shown as 84-88 and 94-98, that are still in superimposition with template 24. In addition to the independent control of fluid flow to air bearing elements 81-88 and 91-98, improved stability of the position between mold 26 and orifice 76 may be achieved by including more air bearing elements in each of air bearings so as to extend the length of the same in the direction of travel.

Figure 12:
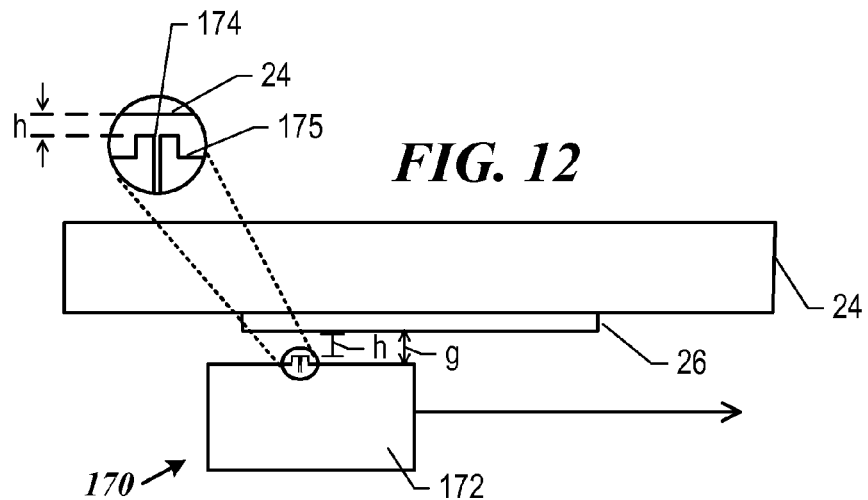
FIG. 12 is a simplified plan view showing a vacuum wipe in accordance with a first alternate embodiment of the present invention.

Referring to FIG. 12, in alternative embodiment, vacuum wipe 170 may be formed with a body 172 in which orifice 174 is disposed upon a region 175, spaced apart from mold 26 a distance, h. The remaining portions of the surface of body 72 facing template 74, is spaced-apart from template 74 a distance g, which is substantially greater than distance h. In this manner, region 175 forms an island.

Figure 13:
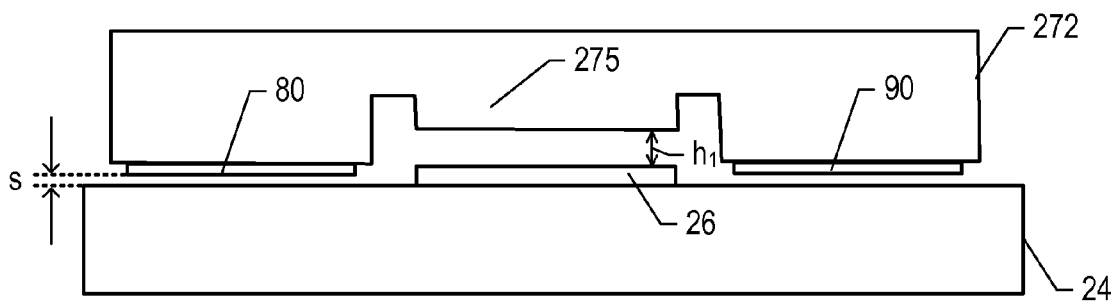
FIG. 13 is a simplified plan view showing a vacuum wipe in accordance with a second alternate embodiment of the present invention.

Referring to FIG. 13, in yet another embodiment, region 275 of body 272 is recessed so as to be spaced apart from mold 26 a distance, $h_1$. Air bearings 80 and 90, however, are spaced-apart from regions of template 24 outside of mold 26 a distance s, which may be the same as or less than distance $h_1$. In this manner, were mold 26 formed as a mesa, mold 26 could be positioned between air bearings 80 and 90 so as to be coplanar therewith.

Referring to FIG. 6, in an alternative embodiment, vacuum wipe may operate as a gas knife. In this manner, pump system 80 creates a positive pressure in volume 74 to produce a high velocity "sheet" of gas (not shown) expelled from orifice 76. This gas "sheet" removes the quantity of fluid not filling the volume of recessions 128, 228 and 328, effectively blowing-off the same. This may be employed in conjunction with the vacuum wipe so that the sheet of gas pushes undesired liquid polymerizable material from the mold 26 and vacuum wipe collects the undesired liquid polymerizable material blown-off by the sheet. Alternating between the gas knife and the vacuum wipe could occur during a single pass or performed on successive passes, as desired. Additionally, the positive pressure in volume 74 may be established so as to function as a drier of fluid disposed on mold 26, e.g., within recessions 128, 228 and 328. In this fashion, the velocity of the "sheet" of gas would be established to reduce the probability of removing fluid on mold 26 while drying the same.

Figure 14:
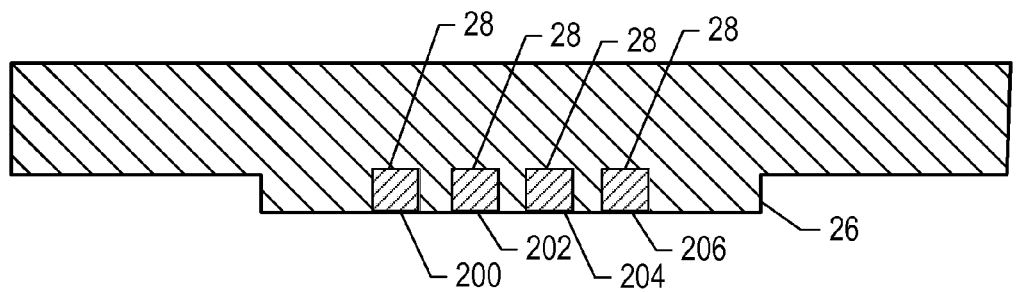
FIG. 14 is a cross-sectional view of the template shown in FIG. 5 taken along lines 14-14.
Figure 15:
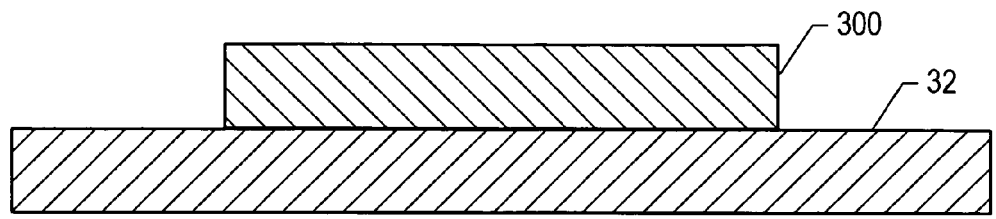
FIG. 15 is a cross-sectional view of a substrate shown in FIG. 1 with a layer of material disposed thereon.
Figure 16:
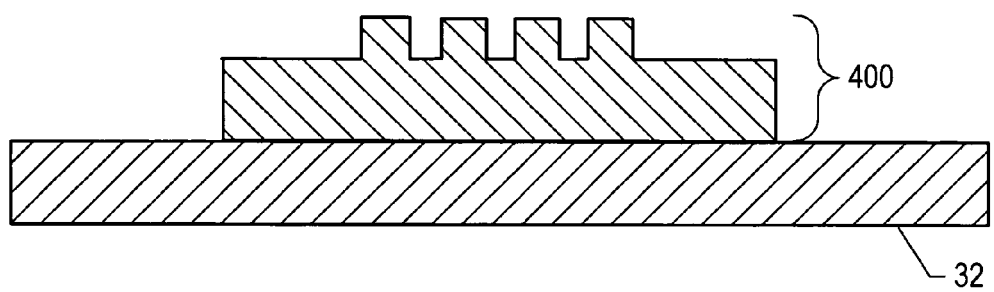
FIG. 16, is a cross-sectional view of the substrate shown in FIG. 15, after patterning thereof with the template shown in FIG. 14, in accordance with one embodiment of the present invention.
Figure 17:
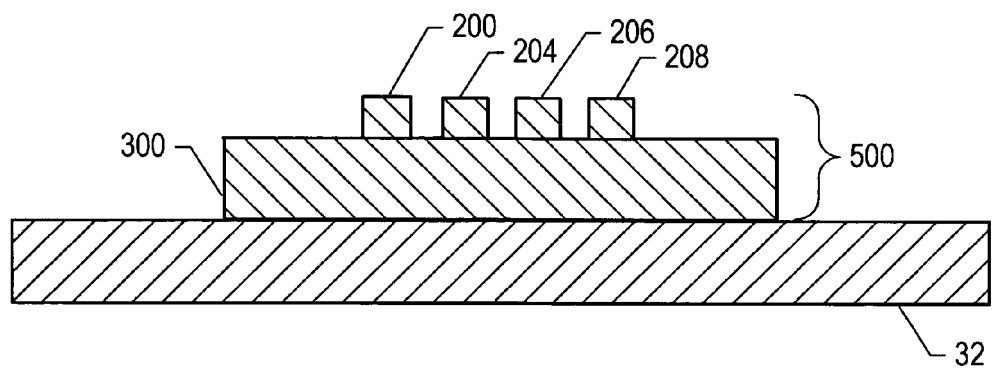
FIG. 17 is a cross-sectional view of the substrate shown in FIG. 15 patterned with the template shown in FIG. 14, in accordance with a first alternate embodiment of the present invention.

The present deposition techniques provide added flexibility when patterning substrates. For example, as shown in FIGS. 14-16, mold 26 may be provided with flowable imprinting material deposited so that only the portions of the same, shown as 200, 202, 204 and 206, present in recesses 28, remain. The quantity (not shown) of flowable imprinting material not disposed within recesses 28 are absent, i.e., removed. As a result, portions 200, 202, 204 and 206, may be disposed on substrate 32, which may have a pre-existing layer thereon, shown as 300. Pre-existing layer may be one of several layers. For example, layer 300 may be flowable polymerizable material deposited employing any number of deposition techniques, including spin-coating and drop dispense techniques. Were layer 300 formed from a material that is polymerized by the same actinic radiation, e.g., by changes in thermal radiation, and changes in ultra violet radiation, as portions 200, 202, 204 and 206, it is possible to deposit portions 200, 202, 204 and 206, before polymerization of the flowable material from which layer 300 is formed. In this manner portions 200, 202, 204 and 206 may be polymerized concurrently with the material from which layer 300 is formed so that the material of portions 200, 202, 204 and 206 may cross-link with the material of layer 300, forming an integral patterned layer 400. As a result, layer 300 defines residual thickness $t_2$, shown in FIG. 2. In other words, the residual thickness $t_2$, of patterned layer 40 may be independent of the fluid dispensed to be imprinted with patterned mold 26. Alternatively, it is possible to deposit portions 200, 202, 204 and 206 upon a layer after solidification of layer 300. In this manner portions are polymerized and cross-linked after deposition thereupon. This requires that the adhesion of the polymerized and cross-linked material from which portions 200, 202, 204 and 206 are formed demonstrate adequate preferential adhesion to solidified layer 300 so that portions 200, 202, 204 and 206 are retained thereon upon separation of mold 26 therefrom. In the present of the aforementioned preferential adhesion, additional deposition techniques may be employed to deposition layer 300, including, but not limited to, atomic layer deposition, chemical vapor deposition, physical vapor deposition spin-on and the like. As a result, patterned layer 500 is formed in which portions 200, 202, 204 and 206 are not integrally formed with layer 300, but are merely adhered thereto as illustrated in FIG. 17. Additionally, it is possible to completely or partially cure portions 200, 202, 204 and 206 before depositing the same on layer 300. This may be achieved, for example, by using the drier function (not shown) mentioned above. Subsequently, layer 300 is polymerized and cross-linked. It should be noted that the matter from which layer 300 may be formed includes constituent components that differ from that which portions 200, 202, 204 and 206 are formed. For example, layer 300 may be formed from an organic material and portions 200, 202, 204 and 206 may be formed from an inorganic material and vice-versa.

Figure 18:
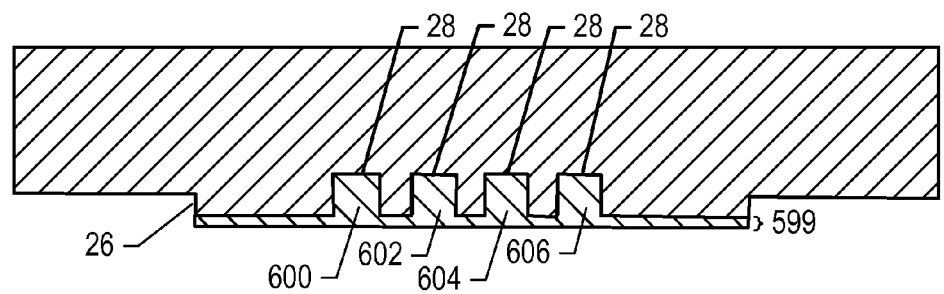
FIG. 18 is a cross-sectional view of the template shown in FIG. 14, having liquid polymerizable layer disposed thereon in accordance with one embodiment of the present invention.
Figure 19:
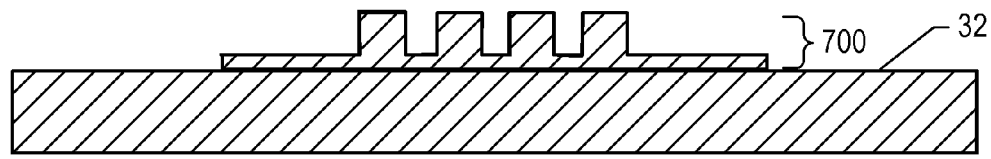
FIG. 19 is a cross-sectional view of the substrate shown in FIG. 1, after patterning thereof with the template shown in FIG. 18 in accordance with a second alternate embodiment of the present invention.
Figure 20:
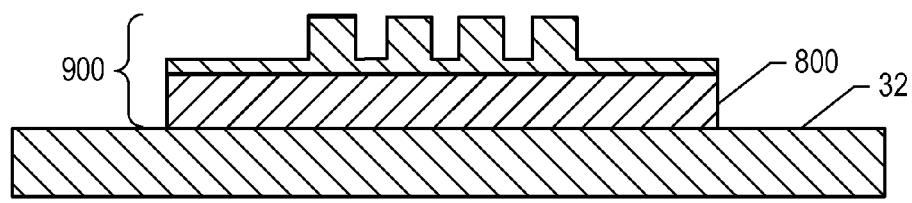
FIG. 20 is a cross-sectional view of the substrate shown in FIG. 15 after patterning thereof with the template shown in FIG. 18, in accordance with a third alternate embodiment of the present invention.

Referring to FIGS. 18-20, it should be noted, however, that benefits may be present when leaving a small portion of a quantity 599 of flowable polymerizable material not present in recesses 28, i.e., the portion of flowable polymerizable material not included in portions 600, 602, 604 and 606. In this manner, quantity 599 defines the residual thickness $t_2$, shown in FIG. 2. The combination of quantity 599 and portions 600, 602, 604 and 606, facilitate fabrication of an integral patterned layer, 700, on substrate 32, with the residual thickness being dependent upon the presence of flowable polymerizable material deposited on mold 26. It is not necessary to deposit layer 700 directly on substrate 32. Rather, substrate may have a pre-existing layer 800 deposited thereon that may have any of the properties discussed above with respect to layer 300. In this manner, patterned layer 700 may be integrally formed with layer 800 (not shown) or may merely be adhered thereto, shown in FIG. 20 as layer 900.

The embodiments of the present invention described above are exemplary. Many changes and modifications may be made to the disclosure recited above, while remaining within the scope of the invention. Therefore, the scope of the invention should not be limited by the above description, but instead should be determined with reference to the appended claims along with their full scope of equivalents.

What is claimed is:

1. A method of depositing material upon a template in an imprint lithography system, said template employing a feature mold having a recess formed into a surface thereof, said method comprising:

depositing a measure of liquid upon said surface whereby a portion of said liquid flows into a volume of said recess and an excess quantity of said liquid is disposed upon regions of said surface proximate to said recess;

positioning an apparatus in superimposition with said template a controllable distance above said surface, said apparatus having a slot extending across a length of said mold, and said apparatus having at least one air bearing located in superimposition with a region of said template outside of said mold wherein said air bearing is coplanar with said mold;

removing said excess quantity of said liquid, using a fluid flow directed through said slot, while maintaining said portion of said liquid within said volume.

2. The method as recited in claim 1 wherein depositing further includes filling said volume with said portion of said liquid.

3. The method as recited in claim 1 wherein removing further includes applying a vacuum to drive said fluid through said slot to act upon said excess quantity of said liquid.

4. The method as recited in claim 1, wherein removing further includes applying a pressure to drive said fluid through said slot to act to upon said excess quantity of said liquid.

5. The method as recited in claim 1 wherein said measure of said liquid is greater than said volume of said recess.

6. The method as recited in claim 1 further including transferring said portion of said liquid onto a substrate.

7. The method as recited in claim 1 further including placing said portion of liquid in contact with a layer of flowable material and cross-linking said liquid portion with said flowable material.

8. The method as recited in claim 7 wherein cross-linking further includes exposing said liquid portion and said flowable material to actinic radiation.

9. The method as recited in claim 7 wherein said liquid portion and said flowable material are polymerizable and cross-linkable in response to actinic radiation.

10. A method of depositing material upon a template in an imprint lithography system, said template employing a featured mold having a recess formed into a surface thereof, said method comprising:

depositing a measure of liquid upon said surface thereby directing a portion of said liquid into a volume of said recess, wherein an excess quantity of said liquid is disposed upon regions of said surface proximate to said recess; and positioning an apparatus in superimposition with said template a controllable distance above said surface, said apparatus having a slot extending across a length of said mold, and said apparatus having at least one air bearing, the air bearing positioned in superimposition with a region of said template outside of said mold wherein said air bearing is coplanar with said mold;

removing said excess quantity of said liquid, using a fluid flow directed through said slot while maintaining said portion of said liquid within said volume, wherein said air bearing creates a positive flow of fluid impinging upon said template pushing said apparatus in a direction opposite from said template.

11. The method as recited in claim 10 further including transferring said portion of said liquid onto a substrate.

12. The method as recited in claim 10 wherein depositing further includes filling said volume with said portion of said liquid.

13. The method as recited in claim 10 wherein removing further includes applying a vacuum to drive said fluid flow through said slot to act upon said excess quantity of said liquid.

14. The method as recited in claim 10 wherein removing further includes applying pressure to drive said fluid through said slot to act to upon said excess quantity of said liquid.

15. The method as recited in claim 10 wherein said measure is greater than said volume.

16. The method as recited in claim 10 further including placing said portion in contact with a layer of flowable material and cross-linking said liquid portion with said flowable material by exposing said liquid and said flowable material to actinic radiation.

17. A method of depositing material upon a template in an imprint lithography system, employing a featured mold having a recess formed into a surface thereof, said method comprising:

filling said recess with a volume of a liquid wherein regions of said surface proximate to said recess receive an excess quantity of said liquid;

positioning an apparatus in superimposition with said template a controllable distance above said surface, said apparatus having a slot extending across a length of said mold, and said apparatus having at least two air bearings, the air bearings located in superimposition with a region of said template such that said mold is positioned between said air bearings wherein said air bearings are coplanar with said mold; and removing said excess quantity of said liquid, using a fluid flow directed through a slot while maintaining said portion of said liquid within said volume.

18. The method as recited in claim 17 further including placing said volume of said liquid in contact with a layer of flowable material and cross-linking volume of said liquid with said flowable material by exposing said volume of said liquid to actinic radiation.

19. The method as recited in claim 18 wherein removing further includes applying a vacuum to drive said fluid flow through said slot to act upon said excess quantity of liquid.

20. The method as recited in claim 18 wherein removing further includes applying a pressure to drive said fluid through said slot to act to upon said excess quantity of said liquid.

* * * * *